United States Patent [19]
Reo

[11] Patent Number: 5,498,644
[45] Date of Patent: Mar. 12, 1996

[54] SILCONE ELASTOMER INCORPORATING ELECTRICALLY CONDUCTIVE MICROBALLOONS AND METHOD FOR PRODUCING SAME

[75] Inventor: Ned J. Reo, Scotia, N.Y.

[73] Assignee: Specialty Silicone Products, Inc., Ballston Spa, N.Y.

[21] Appl. No.: 119,997

[22] Filed: Sep. 10, 1993

[51] Int. Cl.⁶ .................. C08J 9/32; C08K 3/08; H01B 1/06; H01F 1/26
[52] U.S. Cl. .................. 523/218; 524/588; 524/440; 252/511; 252/514; 252/62.54
[58] Field of Search .................. 252/511, 62.54, 252/514; 524/588, 440; 523/218

[56] References Cited

U.S. PATENT DOCUMENTS

| | | | |
|---|---|---|---|
| 2,283,925 | 5/1942 | Harvey | 171/119 |
| 3,668,176 | 6/1972 | Childress | 260/37 EP |
| 3,800,158 | 3/1974 | Grosbard | 250/515 |
| 4,308,155 | 12/1981 | Tada et al. | 252/62.54 |
| 4,331,285 | 5/1982 | Gottwals | 228/173 C |
| 4,431,979 | 2/1984 | Stijntjes et al. | 335/210 |
| 4,474,676 | 10/1984 | Ishino et al. | 252/62.54 |
| 4,501,800 | 2/1985 | Fujiki et al. | 428/447 |
| 4,562,019 | 12/1985 | Inoue | 264/24 |
| 4,601,765 | 7/1986 | Soileau et al. | 148/104 |
| 4,624,798 | 11/1986 | Gindrup et al. | 252/62.54 |
| 4,640,790 | 2/1987 | Sylvester et al. | 252/62.54 |
| 4,710,424 | 12/1987 | Bandara et al. | 428/325 |
| 4,731,286 | 3/1988 | Yamashita et al. | 428/329 |
| 5,051,318 | 9/1991 | Nishikawa et al. | 428/692 |
| 5,069,972 | 12/1991 | Versic | 428/407 |
| 5,082,596 | 1/1992 | Fukuda et al. | 252/511 |

Primary Examiner—Melvyn I. Marquis
Assistant Examiner—Karen A. Dean
Attorney, Agent, or Firm—Schmeiser, Olsen & Watts

[57] ABSTRACT

An electromagnetic interference shielding composition comprising a silicone elastomer having electrically conductive, magnetic, silver coated ceramic microballoons incorporated therein. The silicone elastomer is formed by combining a room temperature vulcanizing silicone rubber, a quantity of electrically conductive microballoons, and a heat cured silicone rubber.

14 Claims, No Drawings

SILICONE ELASTOMER INCORPORATING ELECTRICALLY CONDUCTIVE MICROBALLOONS AND METHOD FOR PRODUCING SAME

FIELD OF THE INVENTION

The present invention relates to a silicone rubber composition and, more particularly, to an electromagnetic interference (EMI) shielding material comprising a silicone elastomer having electrically conductive, magnetic, silver coated ceramic microballoons distributed therein. Further, the present invention provides a novel method for producing the above-described electrically conductive silicone elastomer.

BACKGROUND OF THE INVENTION

Electromagnetic interference shielding materials are typically formed by incorporating particles of an electrically conductive material such as silver, gold, copper, nickel or the like into a nonconductive polymeric substance. More specifically, to obtain an electromagnetic interference shielding effect, an EMI shielding material must provide a pathway for electrical current by establishing an interconnecting arrangement of the electrically conductive particles. Unfortunately, a high density of the electrically conductive particles must be incorporated into the nonconductive polymeric substance in order to provide the electrically conductive interconnecting arrangement required for electromagnetic interference shielding, thereby resulting in the formation of a relatively weighty (high specific gravity) end product having limited applications. Further, the heavy, electrically conductive particles tend to settle throughout the less dense nonconductive polymeric substance during and after production, oftentimes resulting in a shielding material having a nonuniform electrical conductivity.

Low density, lightweight, electrically conductive magnetic microballoons, each comprising a hollow, porous ceramic shell having a surface coating of an electrically conductive material such as silver or the like, have recently been developed in order to overcome the deficiencies of the above-described electrically conductive, metallic particles. More specifically, a large number of the lightweight microballoons may be incorporated into a nonconductive polymeric substance without adversely increasing the overall weight of the resultant composition. Further, the degree of settling within the nonconductive polymeric substance is greatly reduced due to the light weight of the microballoons. Finally, the mutual magnetic attraction between the metal coated, magnetic microballoons greatly facilitates the formation of an electrically conductive, interconnecting arrangement throughout the nonconductive polymeric substance, thereby forming a substantially uniformly conductive composition which is ideally suited for electromagnetic shielding.

As known in the art, conventional silicone rubber curing methods are achieved using vinyl and various types of catalysts. Unfortunately, I have discovered that when electrically conductive, magnetic, silver coated ceramic microballoons are incorporated into conventional silicone rubber base materials in quantities sufficient to provide electrical conductivity, the resultant composition cannot be cured in accordance with conventional silicone rubber curing methods due to a resultant depletion of the catalysts. As a result, there is a tendency for the base materials to break up before a sufficient quantity of the silver coated ceramic microballoons can be added therein to achieve electrical conductivity and EMI effectiveness.

SUMMARY OF THE INVENTION

In order to avoid the disadvantages of the prior art, the present invention provides a novel method for producing an electrically conductive silicone elastomer incorporating electrically conductive, magnetic, silver coated ceramic microballoons therein, wherein the electrically conductive silicone elastomer is highly suited for the shielding of electromagnetic interference.

The electrically conductive silicone elastomer of the present invention is generally produced by suitably mixing a room temperature vulcanizing silicone rubber (RTV) containing a quantity of electrically conductive, magnetic, silver coated ceramic magnetic microballoons, such as the AG500 microballoons manufactured by Spectro Dynamics which have a low specific gravity of between about 0.2 and 2 and a particle size ranging from about 1–500 microns, with a heat curable silicone rubber (HCR). More specifically, in accordance with a preferred embodiment, the present invention utilizes the following curing system, which are more particularly identified in the example below:

| | |
|---|---|
| RTV A | Platinum |
| B | Hydride |
| HCR A | Hydride |
| B | Platinum |

Advantageously, the catalysts are not depleted in response to the addition of silver coated, ceramic microballoons, as in the prior art, due in part to the cross-linking that occurs from the resultant hydride, platinum and vinyl interaction.

Using the above-described curing system, I have discovered that the resultant silicone elastomer can be rendered electrically conductive upon the addition of approximately 20–70% by weight of the AG500 silver coated ceramic microballoons. If less than 20% by weight of the microballoons are utilized, the silicone elastomer will not contain a sufficient quantity of microballoons to form the electrically conductive interconnecting network required for electromagnetic interference shielding. Contrastingly, if more than 70% by weight of the microballoons are employed, the elastomeric quality of the resultant silicone product will be adversely reduced.

Although the silicone elastomer of the present invention has a green strength which allows it to be handled prior to final molding, I have found that the green strength of the silicone elastomer may be increased through the addition of polytetrafluoroethylene, a Teflon powder or the like. More specifically, the Teflon powder acts as a binder which creates excellent green strength when the silicone elastomer is being milled and handled, thereby facilitating the production of sheet stock and the manufacture of parts therefrom.

DETAILED DESCRIPTION OF THE INVENTION

These and other features will become readily apparent upon reading the following example which illustrates the preferred method of producing the electrically conductive silicone elastomer of the present invention.

EXAMPLE

A slurry was formed by mixing a room temperature vulcanizing silicone rubber system comprising 25 pounds of vinylmethylsiloxane having an effective amount of platinum catalyst, RTV 615A (platinum) and 2.5 pounds of methylhydrogensiloxane RTV 615B (hydride), each obtained from General Electric, with 30 pounds of the aforementioned AG500 silver coated ceramic microballoons and 1.5 pounds of a Teflon powder, namely Teflon 6C, manufactured by Dupont. A heat curable silicone rubber system comprising 25 pounds of hydridomethylsiloxane, HCR SE830 (hydride) and 0.25 pounds of vinylmethylsiloxane, and an effective amount of an inhibited platinum catalyst CA4 (platinum), each again obtained from General Electric, was subsequently mixed into the slurry using a two-roll rubber mill at room temperature until a homogeneous mixture was obtained. To prevent the microballoons from being crushed or otherwise damaged during the milling process, the rolls of the rubber mill were set so that the distance therebetween was greater than the maximum diameter of the microballoons.

Unlike the electromagnetic interference shielding materials of the prior art, which typically have specific gravities of 2.0 or more and resistivities of greater than 0.005 ohm cm, the silicone elastomer of the present invention, as formed using the above example, has a specific gravity of less than 1.0 and preferably 0.70 to 0.85, and a low resistivity of 0.002 ohm cm. Thus, the silicone elastomer of the present invention is highly suited for electromagnetic shielding applications requiring a lightweight, highly conductive product. The physical properties of the thus formed silicone elastomer are listed in detail below in TABLE 1.

TABLE 1

Properties

| Shore A | Tensile (psi) | Elongation (%) | Tear (ppi) | Volume Resistivity Ohm cm | Specific Gravity |
|---|---|---|---|---|---|
| 60–70 | 350 | 200 | 60 | .002 | <1.0 |

The EMI shielding characteristics of the silicone shielding elastomer, as formed in the above example and tested in accordance with the procedures and requirements outlined in United States military and automotive specifications MIL-G-83528-B and SAE-ARP-1705, are listed below in TABLES 2–3.

The silicone shielding elastomer of the above example may be molded into a desired product by placing a quantity thereof into a mold and applying a pressure of at least 500 psi for approximately 15 minutes at 177° C. Of course, other molding criteria may be appropriate, depending upon the specific RTV and HCR silicone rubber systems utilized in the practice of the present invention.

The foregoing description of the preferred embodiments of the invention has been presented for purposes of illustration and description. It is not intended to be exhaustive or to limit the invention to the precise form disclosed, and obviously many modifications and variations are possible in light of the above teaching. Such modifications and variations that may be apparent to a person skilled in the art are intended to be included within the scope of this invention as defined by the accompanying claims.

TABLE 2

EMI Shielding Effectiveness
(MIL-G-83528-B)

| FREQUENCY | ATTENUATION |
|---|---|
| 20 MHz | 113 dB |
| 30 MHz | 113 dB |
| 50 MHz | 132 dB |
| 80 MHz | 124 dB |
| 100 MHz | 125 dB |
| 200 MHz | 137 dB |
| 400 MHz | 130 dB |
| 600 MHz | 117 dB |
| 800 MHz | 131 dB |
| 1.0 GHz | 130 dB |
| 2.0 GHz | 118 dB |
| 5.0 GHz | 107 dB |
| 10.0 GHz | 96 dB |

TABLE 3

EMI Shielding Effectiveness
(SAE-ARP-1705)

| FREQUENCY | ATTENUATION | FREQUENCY | ATTENUATION |
|---|---|---|---|
| 10 KHz | 108 dB | 20 MHz | 127 dB |
| 50 KHz | 108 dB | 27 MHz | 137 dB |
| 100 KHz | 107 dB | 37 MHz | 144 dB |
| 180 KHz | 108 dB | 52 MHz | 142 dB |
| 320 KHz | 108 dB | 72 MHz | 152 dB |
| 560 KHz | 108 dB | 100 MHz | 149 dB |
| 1.0 MHz | 108 dB | 133 MHz | 151 dB |
| 2.0 MHz | 109 dB | 200 MHz | 150 dB |
| 3.0 MHz | 111 dB | 560 MHz | 146 dB |
| 4.0 MHz | 113 dB | 700 MHz | 144 dB |
| 6.0 MHz | 116 dB | 800 MHz | 138 dB |
| 10 MHz | 120 dB | 900 MHz | 134 dB |
| 14 MHz | 123 dB | 1.0 GHz | 131 dB |

I claim:
1. A method for making a silicone rubber composition moldable to an electromagnetic interference shielding material having substantially uniform electrical conductivity, which method comprises: blending (A) a heat curable silicone rubber composition comprising vinylmethylsiloxane, an effective amount of an inhibited platinum catalyst, and methylhydrogensiloxane, with (B) a slurry comprising (I) nonconductive microballoons surface coated with a magnetic electrically conductive material, and (II) a room temperature vulcanizable silicone rubber comprising, vinylmethylsiloxane, an effective amount of a platinum catalyst, and a methylhydrogensiloxane, where the microballoons of (B) have a specific gravity is in the range of 0.2 to 2.0 and are utilized in an amount sufficient to produce an electromagnetic interference shielding material having a specific gravity of less than 1.5.

2. A method in accordance with claim 1, where the nonconductive microballoons surface coated with a magnetic electrically conductive material comprise from twenty to seventy percent by weight of the silicone composition.

3. A method in accordance with claim 1, where the electromagnetic shielding material has a specific gravity of 0.003 ohm cm.

4. A method in accordance with claim 2, where the nonconductive microballoons are silver coated ceramic microballoons.

5. A method in accordance with claim 4, where the silver coated ceramic microballoons are magnetic.

6. A method in accordance with claim 1, where the electromagnetic shielding material has a shielding effectiveness of at least 100 dB for electromagnetic waves having frequencies from 10 Khz to 1.0 Ghz.

7. The method in accordance with claim 1, where in prior to blending (A) and (B), sufficient polytetrafluoroethylene powder is used in the slurry of (B) to impart improved milling and handling characteristics thereto;

8. A silicone composition which can be molded to an electromagnetic interference shielding material, comprising (B) a slurry comprising (I) nonconductive microballoons surface coated with a magnetic electrically conductive material, and (II) a room temperature vulcanizable silicone rubber comprising vinylmethylsiloxane, an effective amount of a platinum catalyst, and methylhydrogensiloxane and (A) a heat curable silicone rubber composition comprising vinylmethylsiloxane, an effective amount of an inhibited platinum catalyst, and methylhydrogensiloxane, where the specific gravity of the surface coated microballoons of (B) is in the range of 0.2 to 2.0 and the microballoons are utilized in an amount sufficient to produce an electromagnetic shielding material having a specific gravity of less than 1.5.

9. A silicone composition in accordance with claim 7, where the nonconductive microballoons are present in the range of twenty to seventy percent by weight.

10. A silicone composition in accordance with claim 7, where the electromagnetic shielding effectiveness of the electromagnetic interference shielding material is at least 100 dB for electromagnetic waves having frequencies from 10 Khz to 1.0 Ghz.

11. A molded electromagnetic shielding material in accordance with claim 7, having a volume resistivity of less than 0,003 ohm cm.

12. A silicone composition in accordance with claim 7, where the nonconductive microballoons are silver coated.

13. A silicone composition in accordance with claim 10, where the nonconductive microballoons are magnetic.

14. Electromagnetic interference shielding having a specific gravity of less than 1.5 and substantially uniform electrical conductivity, comprising a molded blend of (A) a heat curable silicone rubber composition, with (B) a slurry consisting essentially of (I) nonconductive microballoons surface coated with a magnetic electrically conductive material, and (ii) a room temperature vulcanizable silicone rubber comprising vinylmethylsiloxane, an effective amount of a platinum catalyst, and a methylhydrogensiloxane, where the microballoons of (B) have a specific gravity is in the range of 0.2 to 2.0.

* * * * *